US011688761B2

(12) United States Patent
Chen

(10) Patent No.: US 11,688,761 B2
(45) Date of Patent: Jun. 27, 2023

(54) MULTILAYER CAPACITIVE ELEMENT HAVING ASPECT RATIO MODULATION STRUCTURE AND DESIGN METHOD OF THE SAME

(71) Applicant: Powerchip Semiconductor Manufacturing Corporation, Hsinchu (TW)

(72) Inventor: Chun-Sheng Chen, Taipei (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 189 days.

(21) Appl. No.: 16/905,926

(22) Filed: Jun. 19, 2020

(65) Prior Publication Data

US 2021/0351267 A1 Nov. 11, 2021

(30) Foreign Application Priority Data

May 8, 2020 (TW) .................................. 109115357

(51) Int. Cl.
*H01G 4/30* (2006.01)
*H01L 49/02* (2006.01)
*G06F 30/10* (2020.01)

(52) U.S. Cl.
CPC .............. *H01L 28/82* (2013.01); *G06F 30/10* (2020.01); *H01G 4/306* (2013.01)

(58) Field of Classification Search
CPC ......... H01L 28/82; H01L 28/40; G06F 30/10; G06F 30/39; H01G 4/306; H01G 4/012; H01G 4/33
See application file for complete search history.

(56) References Cited

U.S. PATENT DOCUMENTS

| 5,879,985 | A | 3/1999 | Gambino et al. |
| 6,215,646 | B1 | 4/2001 | Ochiai et al. |
| 6,259,149 | B1* | 7/2001 | Burkhardt ......... H01L 29/66181 257/E21.396 |
| 6,436,787 | B1 | 8/2002 | Shih et al. |
| 9,865,675 | B2* | 1/2018 | Wang ..................... H01L 28/90 |
| 10,008,558 | B1* | 6/2018 | Yang ................. H01L 21/32051 |

(Continued)

FOREIGN PATENT DOCUMENTS

| TW | 201104714 | 2/2011 |
| TW | 202013442 | 4/2020 |

OTHER PUBLICATIONS

"Office Action of Taiwan Counterpart Application", dated Aug. 19, 2020, p. 1-p. 11.

*Primary Examiner* — David M Sinclair
*Assistant Examiner* — Daniel M Dubuisson
(74) *Attorney, Agent, or Firm* — JCIPRNET

(57) ABSTRACT

A multilayer capacitive element and a design method of the same are provided. The capacitive element includes a substrate having a groove, a first aspect ratio modulation structure, and a plurality of conductive layers and a plurality of dielectric layers. The first aspect ratio modulation structure is located in the groove to define the groove as a first region and a first modulation region, wherein an aspect ratio of the first modulation region is different from that of the first region. The plurality of conductive layers and the plurality of dielectric layers are alternately stacked in the groove.

11 Claims, 14 Drawing Sheets

(56) References Cited

U.S. PATENT DOCUMENTS

| | | | |
|---|---|---|---|
| 2004/0113235 A1* | 6/2004 | Coolbaugh | H01L 21/76807 257/E21.018 |
| 2011/0019335 A1* | 1/2011 | Wu | H01G 4/005 361/303 |
| 2011/0175152 A1* | 7/2011 | Booth, Jr. | H01L 28/40 257/350 |
| 2013/0175666 A1* | 7/2013 | Tran | H01L 28/40 257/532 |
| 2016/0284694 A1* | 9/2016 | Chou | H01L 28/92 |
| 2019/0103227 A1* | 4/2019 | Lu | H01G 4/385 |
| 2020/0005999 A1* | 1/2020 | Masuda | H01G 4/12 |
| 2020/0066922 A1* | 2/2020 | Cheng | H01L 27/016 |
| 2020/0098855 A1* | 3/2020 | Kuo | H01L 28/91 |
| 2020/0176552 A1* | 6/2020 | Chang | H01L 23/5329 |
| 2021/0027950 A1* | 1/2021 | Nakagawa | H01G 4/33 |

* cited by examiner

MULTILAYER CAPACITIVE ELEMENT HAVING ASPECT RATIO MODULATION STRUCTURE AND DESIGN METHOD OF THE SAME

CROSS-REFERENCE TO RELATED APPLICATION

This application claims the priority benefit of Taiwan application no. 109115357, filed on May 8, 2020. The entirety of the above-mentioned patent application is hereby incorporated by reference herein and made a part of this specification.

BACKGROUND OF THE INVENTION

Field of the Invention

The invention relates to a capacitive element and a design method of the capacitive element, and particularly relates to a multilayer capacitive element and a design method of the multilayer capacitive element.

Description of Related Art

Compared with other types of capacitors, grooved multilayer capacitors have higher power density in semiconductor integrated circuits. Under the requirement of continuous miniaturization, deposited films are thinner and thinner. However, the above limitation may result in an issue that a contact is not readily formed because the thickness of the film is too small during the extraction of an electrode.

Therefore, there is still a need for an improved multilayer capacitor with a greater area for extracting an electrode.

SUMMARY OF THE INVENTION

The invention provides a multilayer capacitor element from which an electrode is more readily extracted.

The invention provides a design method of a multilayer capacitive element. An electrode is more readily extracted from the designed multilayer capacitive element.

The invention provides a multilayer capacitive element including a substrate, a first aspect ratio modulation structure, and a plurality of conductive layers and a plurality of dielectric layers. The substrate has a groove. The first aspect ratio modulation structure is located in the groove to define the groove as a first region and a first modulation region, wherein an aspect ratio of the first modulation region is different from an aspect ratio of the first region. The plurality of conductive layers and the plurality of dielectric layers are alternately stacked in the groove.

In an embodiment of the invention, a topmost conductive layer in the plurality of conductive layers completely fills a space of the groove.

In an embodiment of the invention, at least one conductive layer in the plurality of conductive layers is extended from the first region to the first modulation region.

In an embodiment of the invention, a topmost conductive layer in the at least one conductive layer extended from the first region to the first modulation region completely fills a space of the groove of the modulation region.

In an embodiment of the invention, the first aspect ratio modulation structure defines the groove as the first region, the first modulation region, and a second region, wherein the first modulation region is located between the first region and the second region, and the aspect ratio of the first modulation region is different from the aspect ratio of the first region and an aspect ratio of the second region.

In an embodiment of the invention, at least one conductive layer in the plurality of conductive layers is extended from the first region to the first modulation region and the second region.

In an embodiment of the invention, a topmost conductive layer in the at least one conductive layer extended from the first region to the first modulation region and the second region completely fills a space of the groove of the first modulation region.

In an embodiment of the invention, the multilayer capacitive element further includes a second aspect ratio modulation structure. The second aspect ratio modulation structure is located in the first region to define the first region as a third region, a second modulation region, and a fourth region, wherein an aspect ratio of the second modulation region is different from an aspect ratio of the third region and an aspect ratio of the fourth region.

In an embodiment of the invention, at least one conductive layer in the plurality of conductive layers is extended from the third region to the second modulation region and the fourth region.

In an embodiment of the invention, a topmost conductive layer in the at least one conductive layer extended from the third region to the second modulation region and the fourth region completely fills a space of the groove of the second modulation region.

In an embodiment of the invention, a material of the first aspect ratio modulation structure is the same as a material of the substrate.

In an embodiment of the invention, a material of the second aspect ratio modulation structure is the same as a material of the substrate.

In an embodiment of the invention, a bottommost layer in the plurality of conductive layers and the plurality of dielectric layers is the conductive layer.

In an embodiment of the invention, a bottommost layer in the plurality of conductive layers and the plurality of dielectric layers is the dielectric layer.

The invention provides a design method of a multilayer capacitive element including the following steps. Step a), a predetermined capacitance value needed for a multilayer capacitive element is determined. Step b), a starting geometric boundary of a groove in the multilayer capacitive element is defined. Step c), a space of the groove is divided into a plurality of lattice points. Step d), a maximum allowable number of deposited layers of each of the lattice points is calculated. Step e), a connection position of an electrode is determined according to the predetermined capacitance value.

In an embodiment of the invention, calculating the maximum allowable number of deposited layers of each of the lattice points includes the following steps. A first allowable number of deposited layers of each of the lattice points on an X-Z plane is calculated, wherein the X direction is parallel to a bottom surface of the groove and the Z direction is perpendicular to the bottom surface of the groove. A second allowable number of deposited layers of each of the lattice points on a Y-Z plane is calculated, wherein the Y direction is parallel to the bottom surface of the groove and perpendicular to the X direction and the Z direction. A third allowable number of deposited layers of each of the lattice points in the Z direction obtained from an end position of a predetermined planarization process is calculated. A minimum value in the first allowable number of deposited layers, the second allowable number of deposited layers, and the third allowable number of deposited layers of each of the lattice points is determined as the maximum allowable number of deposited layers of each of the lattice points.

In an embodiment of the invention, the design method of the multilayer capacitive element further includes Step f): whether the connection position of the electrode satisfies a preset condition is detected, wherein when the connection position of the electrode satisfies the preset condition, the connection position of the electrode is kept, and when the connection position of the electrode does not satisfy the preset condition, a geometric boundary of the groove in the multilayer capacitive element is changed again, and Step c), Step d), and Step e) are repeated.

In an embodiment of the invention, the preset condition includes that a capacitance value of the capacitive element satisfies the predetermined capacitance value, and an area of the connection position of the electrode is greater than a predetermined area.

In an embodiment of the invention, changing the geometric boundary of the groove in the multilayer capacitive element includes changing the geometric boundary of the groove using a modulation structure to change an aspect ratio of a partial region in the groove.

Based on the above, in the multilayer capacitor element and the design method thereof provided by the invention, the geometric boundary of the groove and the aspect ratio of the partial region may be changed via the aspect ratio modulation structure to design a multilayer capacitive element with a predetermined capacitance value and greater connection area.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7A and FIG. 7B are top views of a simulated multilayer capacitive element of an embodiment of the invention.

DESCRIPTION OF THE EMBODIMENTS

Figure 1:
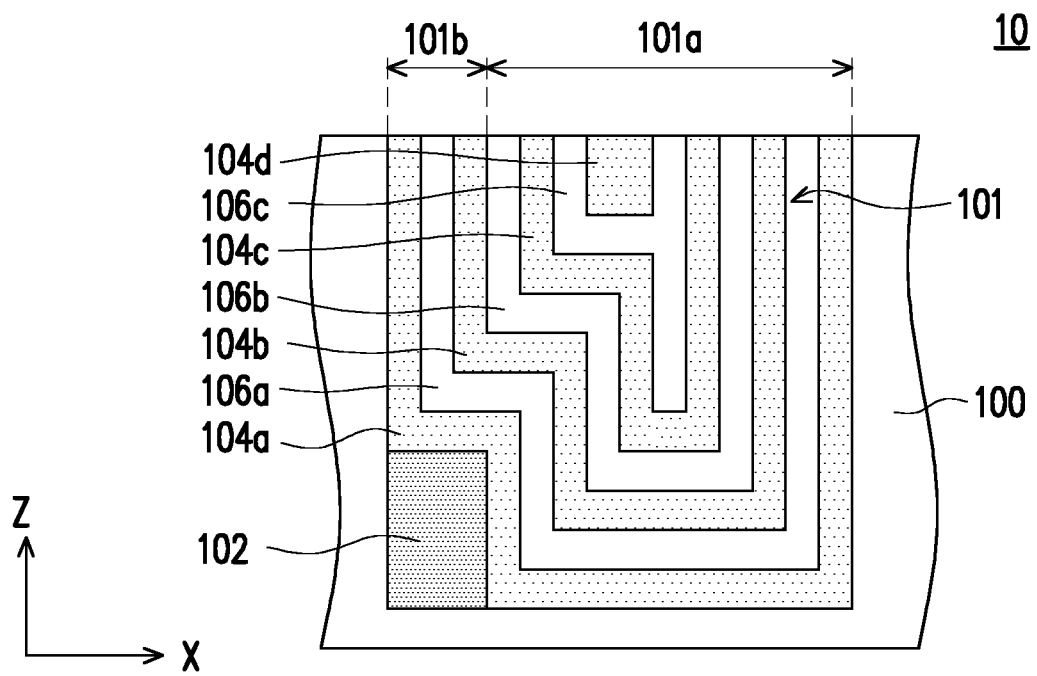
FIG. 1 is a cross-sectional view of a capacitive element according to an embodiment of the invention.

The terms used in the following description are customary terms in the technical field. If some terms are explained or defined in the specification, the interpretation of the terms is based on the description or definition in the present specification.

The following provides many different embodiments or examples for implementing different features of the provided subject matter. To simplify the invention, specific examples of components and configurations are described below. Of course, these are only examples and are not intended to be limiting. For example, in the following description, forming a first feature above or on a second feature may include embodiments in which the first feature and the second feature are formed to be in direct contact, and may also include embodiments in which additional features may be formed between the first feature and the second feature such that the first feature and the second feature are not in direct contact. In addition, in the invention, reference numerals and/or letters may be repeated in various examples. This repetition is for simplicity and clarity and does not itself determine the relationship between the various embodiments and/or configurations discussed.

Furthermore, spatially related terms such as "below", "under", "beneath", "above", "on" and similar terms may be used in the present specification to describe the relative relationship between one element or feature to another element (or elements) or feature as shown in the figures. In addition to the orientation drawn in the figures, these spatially related terms are also intended to cover different orientations of a device in use or operation. The equipment may be oriented in other ways (rotated 90 degrees or at other orientations), and the spatially related specifiers used in the present specification may be interpreted in a similar manner.

In the present embodiment, a method of forming the capacitive element may include the following steps. First, a groove is formed in a substrate. In an embodiment, a two-dimensional array of grooves may be formed in the substrate. Next, a modulation structure is formed in the groove to change the geometric boundary of the groove, thereby changing the aspect ratio of a partial region in the groove. Then, a plurality of conductive layers and a plurality of dielectric layers stacked alternately are formed in the groove to cover the substrate, and the topmost conductive layer in the plurality of conductive layers completely fills the groove. In the present embodiment, the plurality of conductive layers and the plurality of dielectric layers are stacked vertically (i.e., along the Z direction) and conformally formed in the groove. Then, a planarization process is performed to remove a portion of the conductive layers and the dielectric layers up to a predetermined position. In an embodiment, the planarization process is, for example, a chemical mechanical polishing process or etching back. In the present embodiment, a contact may be further formed on the topmost conductive layer completely filling the groove.

FIG. 1 is a cross-sectional view of a capacitive element according to an embodiment of the invention. A capacitive element 10 includes a substrate 100, an aspect ratio modulation structure 102, a plurality of conductive layers 104a to 104d, and a plurality of dielectric layers 106a to 106c. In the present embodiment, the substrate 100 is, for example, a silicon substrate. In an embodiment, the substrate 100 is doped with a P-type dopant (e.g. boron). In the present embodiment, the substrate 100 is a P-type substrate. In an embodiment, the substrate 100 is doped with an N-type dopant (e.g. phosphorus or arsenic). In the present embodiment, the substrate 100 is an N-type substrate. In an embodiment, the substrate 100 is a semiconductor-on-insulator (SOI) substrate.

The aspect ratio modulation structure 102 is located in a groove 101 of the substrate 100. In the present embodiment, the aspect ratio modulation structure 102 is defined as a geometric object in three-dimensional space. When the aspect ratio modulation structure 102 is disposed in the groove 101, the space occupied by the aspect ratio modulation structure 102 may no longer be used by a capacitor (i.e., a multilayer capacitor may not be formed in the space occupied by the aspect ratio modulation structure 102). In the present embodiment, the material of the aspect ratio modulation structure 102 may be the same as the material of the substrate 100 to facilitate the compatibility of the manufacturing process, but the invention is not limited thereto. In another embodiment, the material of the aspect ratio modulation structure 102 may also be different from the material of the substrate 100.

In the present embodiment, the aspect ratio modulation structure 102 defines the groove 101 in the X direction as a first region 101a and a modulation region 101b, wherein the aspect ratio of the modulation region 101b is different from the aspect ratio of the first region 101a. In the present embodiment, since the aspect ratio modulation structure 102 is disposed in the groove 101, the geometric boundary of the groove 101 is changed, thereby changing the aspect ratio of a partial region (i.e., the modulation region 101b) in the groove 101. As shown in FIG. 1, the depth of the groove of the modulation region 101b (i.e., the height in the Z direction) is less than the depth of the groove of the first region 101a, so the aspect ratio of the modulation region 101b is different from the aspect ratio of the first region 101a.

In the present embodiment, the number of the aspect ratio modulation structure 102 is one, and the aspect ratio modulation structure 102 is disposed at the junction of the bottom surface and the side surface of the groove 101 (as shown in FIG. 1), but the invention is not limited thereto.

The plurality of conductive layers 104a to 104d and the plurality of dielectric layers 106a to 106c are alternately stacked in the groove 101. In the present embodiment, the material of the conductive layers 104a to 104d is, for example, polysilicon. In the present embodiment, the conductive layers 104a to 104d have positive and negative interleaved electrical properties. The insulating material of the dielectric layers 106a to 106c is, for example, an oxide layer, a nitride layer, or an oxide/nitride/oxide (ONO) composite layer.

The topmost conductive layer of the conductive layers 104a to 104d (that is, the conductive layer 104d) completely fills the space of the groove 101. In the present embodiment, as shown in FIG. 1, the number of conductive layers and dielectric layers is four and three, respectively, but the invention is not limited thereto. The number of conductive layers and dielectric layers in FIG. 1 is only exemplary. The number of conductive layers and dielectric layers may be changed according to requirements, as long as the topmost conductive layer in the plurality of conductive layers completely fills the space of the groove 101. In the present embodiment, as shown in FIG. 1, the conductive layer is first disposed in the groove, but the invention is not limited thereto. However, in another embodiment, the dielectric layer may be disposed in the groove 101 first, as long as the topmost conductive layer in the plurality of conductive layers completely fills the space of the groove 101.

In the present embodiment, the top surface of the topmost conductive layer (that is, the conductive layer 104d) completely filling the groove 101 has a greater area than the top surfaces of other layers and is therefore suitable as a connection position of an electrode (the position at which a contact is formed).

In the present embodiment, an interlayer dielectric layer may be disposed on the conductive layers and the dielectric layers and a first contact may be formed on the top surface of the conductive layer 104d (not shown). In an embodiment, the first contact may be formed on the top surface of the conductive layer 104d, a second contact may be formed on the top surface of the conductive layer 104c, and a third contact may be formed on the top surface of the conductive layer 104b, and/or a fourth contact may be formed on the top surface of the conductive layer 104a (not shown). In an embodiment, the first contact and the third contact may be electrically connected to the first electrode, and the second contact and the fourth contact may be electrically connected to the second electrode.

Figure 2:
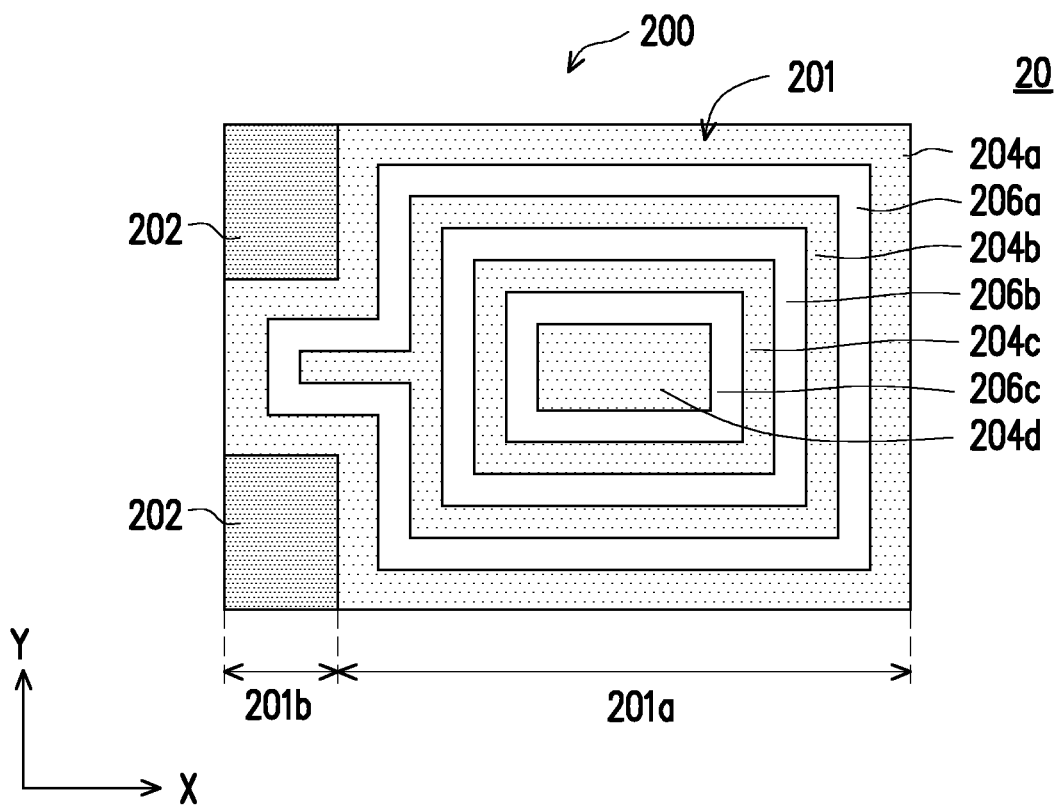
FIG. 2 is a top view of a capacitive element according to an embodiment of the invention.

FIG. 2 is a top view of a capacitive element 20 according to an embodiment of the invention. In the present embodiment, a portion of the content of the above embodiment is used, and the description of the same technical content is omitted.

Referring to FIG. 2, an aspect ratio modulation structure 202 is located in a groove 201 of a substrate 200. In the present embodiment, two independent aspect ratio modulation structures 202 define the groove 201 in the X direction as a first region 201a and a modulation region 201b, wherein the aspect ratio of the modulation region 201b is different from the aspect ratio of the first region 201a. In the present embodiment, since the aspect ratio modulation structures 202 are disposed in the groove 201, the geometric boundary of the groove 201 is changed, thereby changing the aspect ratio of a partial region (i.e., the modulation region 201b) in the groove 201. As shown in FIG. 2, the width of the groove of the modulation region 201b (i.e., the width in the Y direction) is less than the width of the groove of the first region 201a, so the aspect ratio of the modulation region 201b is different from the aspect ratio of the first region 201a.

A plurality of conductive layers 204a to 204d and a plurality of dielectric layers 206a to 206c are alternately stacked in the groove 201. In the present embodiment, at least one conductive layer in the conductive layers 204a to 204d is extended from the first region 201a to the modulation region 201b. As shown in FIG. 2, the conductive layer 204a and the conductive layer 204b are extended from the first region 201a to the modulation region 201b. The conductive layer 204c and the conductive layer 204d are only disposed in the first region 201a.

In the present embodiment, the topmost conductive layer (i.e., the conductive layer 204b) in the conductive layers (i.e., the conductive layer 204a and the conductive layer 204b) extended from the first region 201a to the modulation region 201b completely fills the space of the groove of the modulation region 201b.

In the present embodiment, since the aspect ratio modulation structures 202 form the first region 201a and the modulation region 201b with different aspect ratios, during the deposition of the plurality of conductive layers and the plurality of dielectric layers, the groove of the modulation region 201b is completely filled first (for example, the groove of the modulation region 201b is filled first by the conductive layer 204b). After the subsequent mechanical polishing process, the layers deposited after the conductive layer 204b in the modulation region 201b are all completely removed. Specifically, the conductive layer 204c, the conductive layer 204d, the dielectric layer 206b, and the dielectric layer 206c of the modulation region 201b are all completely removed. In other words, in the first region 201a, all designed conductive layers and dielectric layers may be completely formed. In the modulation region 201b, none of the layers after the conductive layer 204b completely filling the groove of the modulation region 201b may be formed.

Therefore, the modulation region 201b blocks the connection of all layers after the conductive layer 204b.

In the present embodiment, as shown in FIG. 2, the region of the conductive layer 204b protruded from the first region 201a toward the modulation region 201b (that is, the convex contact region) has a greater area and is therefore suitable as a connection position of an electrode (that is, the position at which a contact is formed).

In the present embodiment, an interlayer dielectric layer may be disposed on the conductive layers and the dielectric layers and a first contact may be formed on the top surface of the conductive layer 204b (not shown). More specifically, the first contact may be formed on a region of the conductive layer 204b protruded from the first region 201a toward the modulation region 201b.

In an embodiment, the first contact may be formed on the top surface of the conductive layer 204b, a second contact may be formed on the top surface of the conductive layer 204a, and a third contact may be formed on the top surface of the conductive layer 204c, and/or a fourth contact may be formed on the top surface of the conductive layer 204d (not shown). In an embodiment, the first contact and the third contact may be electrically connected to the first electrode, and the second contact and the fourth contact may be electrically connected to the second electrode.

Figure 3:
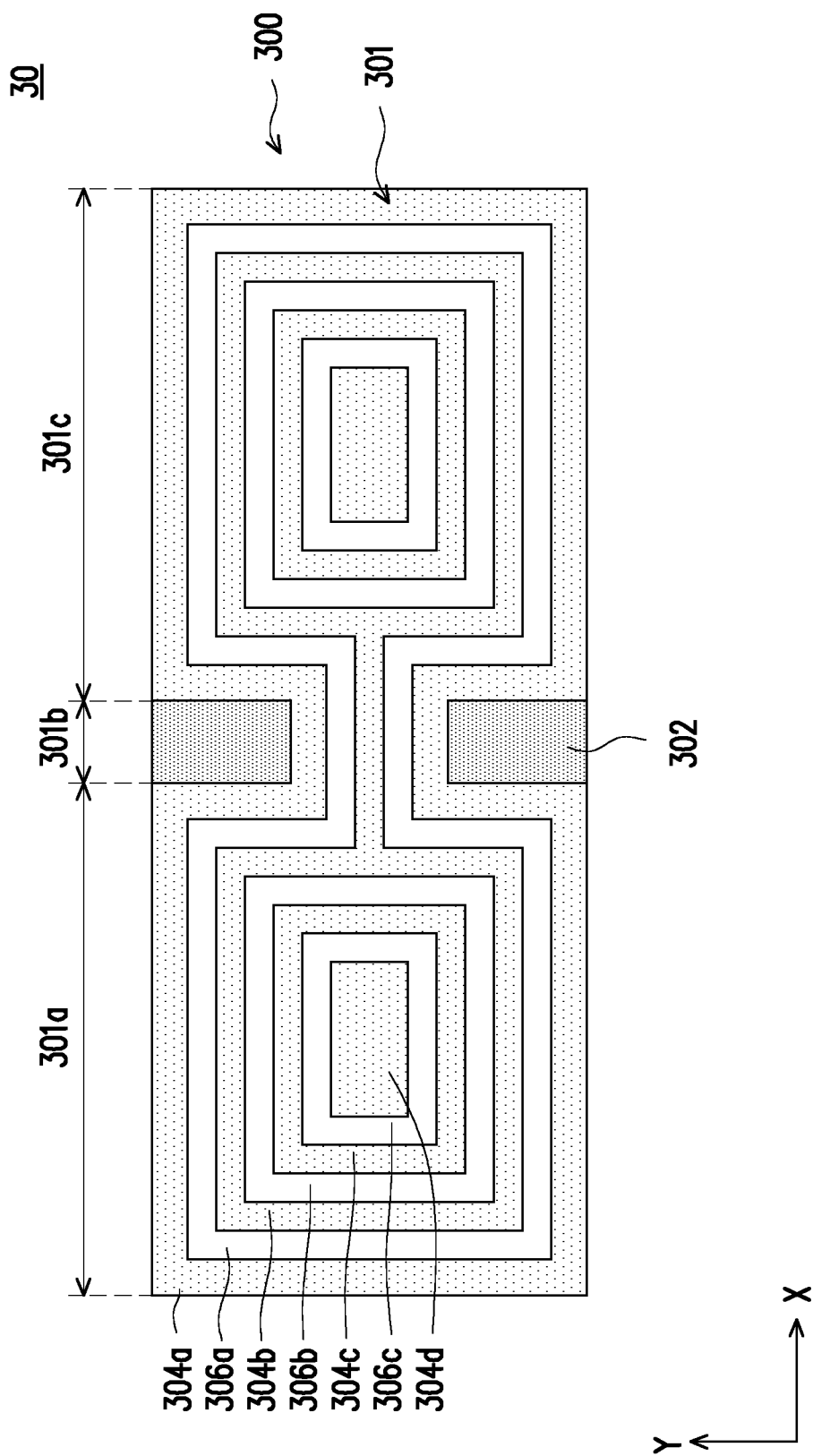
FIG. 3 is a top view of a capacitive element according to another embodiment of the invention.

FIG. 3 is a top view of a capacitive element 30 according to another embodiment of the invention. In the present embodiment, a portion of the content of the above embodiment is used, and the description of the same technical content is omitted.

Referring to FIG. 3, an aspect ratio modulation structure 302 is located in a groove 301 of a substrate 300. In the present embodiment, two independent aspect ratio modulation structures 302 define the groove 301 in the X direction as a first region 301a, a modulation region 301b, and a second region 301c, wherein the modulation region 301b is located between the first region and the second region, and the aspect ratio of the modulation region 301b is different from the aspect ratio of the first region 301a and the aspect ratio of the second region 301c. In the present embodiment, since the aspect ratio modulation structures 302 are disposed in the groove 301, the geometric boundary of the groove 301 is changed, thereby changing the aspect ratio of a partial region (i.e., the modulation region 301b) in the groove 301. As shown in FIG. 3, the width of the groove of the modulation region 301b (that is, the width in the Y direction) is less than the width of the groove of the first region 301a and the second region 301c, so the aspect ratio of the modulation region 301b is different from the aspect ratio of the first region 301a and the aspect ratio of the second region 301c.

A plurality of conductive layers 304a to 304d and a plurality of dielectric layers 306a to 306c are alternately stacked in the groove 301. In the present embodiment, at least one conductive layer in the conductive layers 304a to 304d is extended from the first region 301a to the modulation region 301b and the second region 301c. As shown in FIG. 1, the conductive layer 304a and the conductive layer 304b are extended from the first region 301a to the modulation region 301b and the second region 301c. More specifically, the conductive layer 304a and the conductive layer 304b in the first region 301a, the modulation region 301b, and the second region 301c are continuously connected. That is, the first region 301a and the second region 301c are bridged by the conductive layer 304a and the conductive layer 304b of the modulation region 301b. In the present embodiment, the conductive layer 304c and the conductive layer 304d are only disposed in the first region 301a and the second region 301c.

In the present embodiment, the topmost conductive layer (i.e., the conductive layer 304b) in the conductive layers (i.e., the conductive layer 304a and the conductive layer 304b) extended from the first region 301a to the modulation region 301b and the second region 301c completely fills the space of the groove of the modulation region 301b.

In the present embodiment, since the aspect ratio modulation structures 302 form the modulation region 301b having a different aspect ratio than the first region 301a and the second region 301c, during the deposition of the plurality of conductive layers and the plurality of dielectric layers, the groove of the modulation region 301b is completely filled first (for example, the groove of the modulation region 301b is completely filled by the conductive layer 304b first). After the subsequent mechanical polishing process, the layers deposited after the conductive layer 304b in the modulation region 301b are all completely removed. Specifically, the conductive layer 304c, the conductive layer 304d, the dielectric layer 306b, and the dielectric layer 306c of the modulation region 301b are all completely removed. In other words, in the first region 301a and the second region 301c, all designed conductive layers and dielectric layers may be completely formed. In the modulation region 301b, none of the layers after the conductive layer 304b completely filling the groove of the modulation region 301b may be formed. Therefore, the modulation region 301b blocks the connection of all layers after the conductive layer 304b.

In the present embodiment, the region of the conductive layer 304b protruded from the first region 301a toward the modulation region 301b (or the region of the conductive layer 304b protruded from the second region 301c toward the modulation region 301b) has a greater area (FIG. 3) and is therefore suitable as a connection position of an electrode (that is, the position at which a contact is formed).

In the present embodiment, an interlayer dielectric layer may be disposed on the conductive layers and the dielectric layers and a first contact may be formed on the top surface of the conductive layer 304b (not shown). More specifically, the first contact may be formed on a region of the conductive layer 304b protruded from the first region 301a toward the modulation region 301b (or a region of the conductive layer 304b protruded from the second region 301c toward the modulation region 301b).

In an embodiment, the first contact may be formed on the top surface of the conductive layer 304b, a second contact may be formed on the top surface of the conductive layer 304a, and a third contact may be formed on the top surface of the conductive layer 304c, and/or a fourth contact may be formed on the top surface of the conductive layer 304d (not shown). In an embodiment, the first contact and the third contact may be electrically connected to the first electrode, and the second contact and the fourth contact may be electrically connected to the second electrode.

Figure 4:
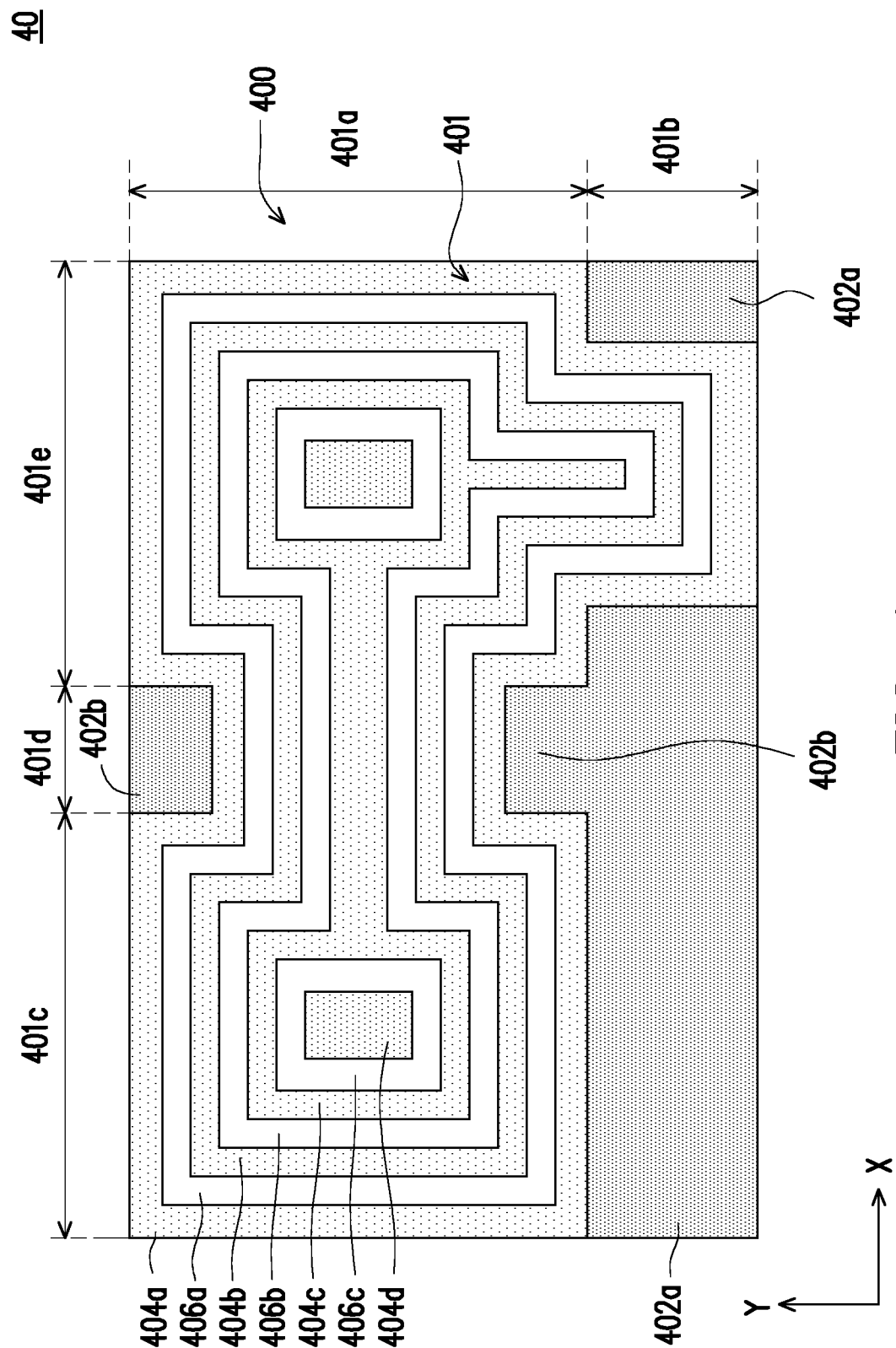
FIG. 4 is a top view of a capacitive element according to yet another embodiment of the invention.

FIG. 4 is a top view of a capacitive element according to yet another embodiment of the invention. In the present embodiment, a portion of the content of the above embodiment is used, and the description of the same technical content is omitted.

Referring to FIG. 4, a first aspect ratio modulation structure 402a is located in a groove 401 of a substrate 400. In the present embodiment, two independent first aspect ratio modulation structures 402a define the groove 401 in the Y direction as a first region 401a and a first modulation region 401b, wherein the aspect ratio of the first modulation region 401b is different from the aspect ratio of the first region 401a. In the present embodiment, since the first aspect ratio modulation structures 402a are disposed in the groove 401, the geometric boundary of the groove 401 is changed, thereby changing the aspect ratio of a partial region (i.e., the modulation region 401b) in the groove 401. As shown in FIG. 4, the width of the groove of the first modulation region 401b (i.e., the width in the X direction) is less than the width of the groove of the first region 401a, so the aspect ratio of the first modulation region 401b is different from the aspect ratio of the first region 401a.

In the present embodiment, the capacitive element 40 may further include a second aspect ratio modulation structure 402b, wherein the second aspect ratio modulation structure 402b is located in the first region 401a. In the present embodiment, two independent second aspect ratio modulation structures 402b define the first region 401a as a third region 401c, a second modulation region 401d, and a fourth region 401e in the X direction, wherein the second modulation region 401d is located between the third region 401c and the fourth region 401e, and the aspect ratio of the second modulation region 401d is different from the aspect ratio of the third region 401c and the aspect ratio of the fourth region 401e. In the present embodiment, since the second aspect ratio modulation structures 402b are disposed in the first region 401a, the geometric boundary of the groove 401 is changed, thereby changing the aspect ratio of a partial region (i.e., the second modulation region 401d) in the first region 401a. As shown in FIG. 4, the width of the groove of the second modulation region 401d (that is, the width in the Y direction) is less than the width of the groove of the third region 401c and the fourth region 401e, so the aspect ratio of the second modulation region 401d is different from the aspect ratio of the third region 401c and the aspect ratio of the fourth region 401e.

A plurality of conductive layers 404a to 404d and a plurality of dielectric layers 406a to 406c are alternately stacked in the groove 401. In the present embodiment, at least one conductive layer in the conductive layers 404a to 404d is extended from the first region 401a to the first modulation region 401b. More specifically, at least one conductive layer in the conductive layers 404a to 404d is extended from the third region 401c to the second modulation region 401d, the fourth region 401e, and the first modulation region 401b.

As shown in FIG. 4, the conductive layer 404a, the conductive layer 404b, and the conductive layer 404c are extended from the third region 401c to the second modulation region 401d, the fourth region 401e, and the first modulation region 401b. The conductive layer 404a, the conductive layer 404b, and the conductive layer 404c are extended from the first region 401a to the first modulation region 401b. In the present embodiment, the conductive layer 404a, the conductive layer 404b, and the conductive layer 404c in the third region 401c, the second modulation region 401d, the fourth region 401e, and the first modulation region 401b are continuously connected. In the present embodiment, the third region 401c and the fourth region 401e are bridged by the conductive layer 404a, the conductive layer 404b, and the conductive layer 404c of the second modulation region 401d. In the present embodiment, the conductive layer 404d is only disposed in the third region 401c and the fourth region 401e.

In the present embodiment, the topmost conductive layer (i.e., the conductive layer 404c) in the conductive layers extended from the first region 401a to the first modulation region 401b completely fills the space of the groove of the first modulation region 401b. The topmost conductive layer (i.e., the conductive layer 404c) in the conductive layers extended from the third region 401c to the second modulation region 401d and the fourth region 401e completely fills the space of the groove of the second modulation region 401d.

In the present embodiment, a region of the conductive layer 404c protruded from the first region 401a toward the first modulation region 401b has a greater area (shown in FIG. 4) and is therefore suitable as a connection position of an electrode (that is, a position at which a contact is formed). A region of the conductive layer 404c protruded from the third region 401c toward the second modulation region 401d (or a region of the conductive layer 404c protruded from the fourth region 401e toward the second modulation region 401d) has a greater area, and therefore is also suitable as a connection location of an electrode. In the present embodiment, both the convex contact region and the bridge region are the conductive layer 404c, but the invention is not limited thereto. In another embodiment, the convex contact region and the bridge region may be different conductive layers.

In order to facilitate the connection of the conductive layer of the prepared capacitive element to an electrode, the invention provides a design method of a multilayer capacitive element that may achieve the above object. In the following, embodiments are provided to describe actual implementations of the invention.

Figure 5:
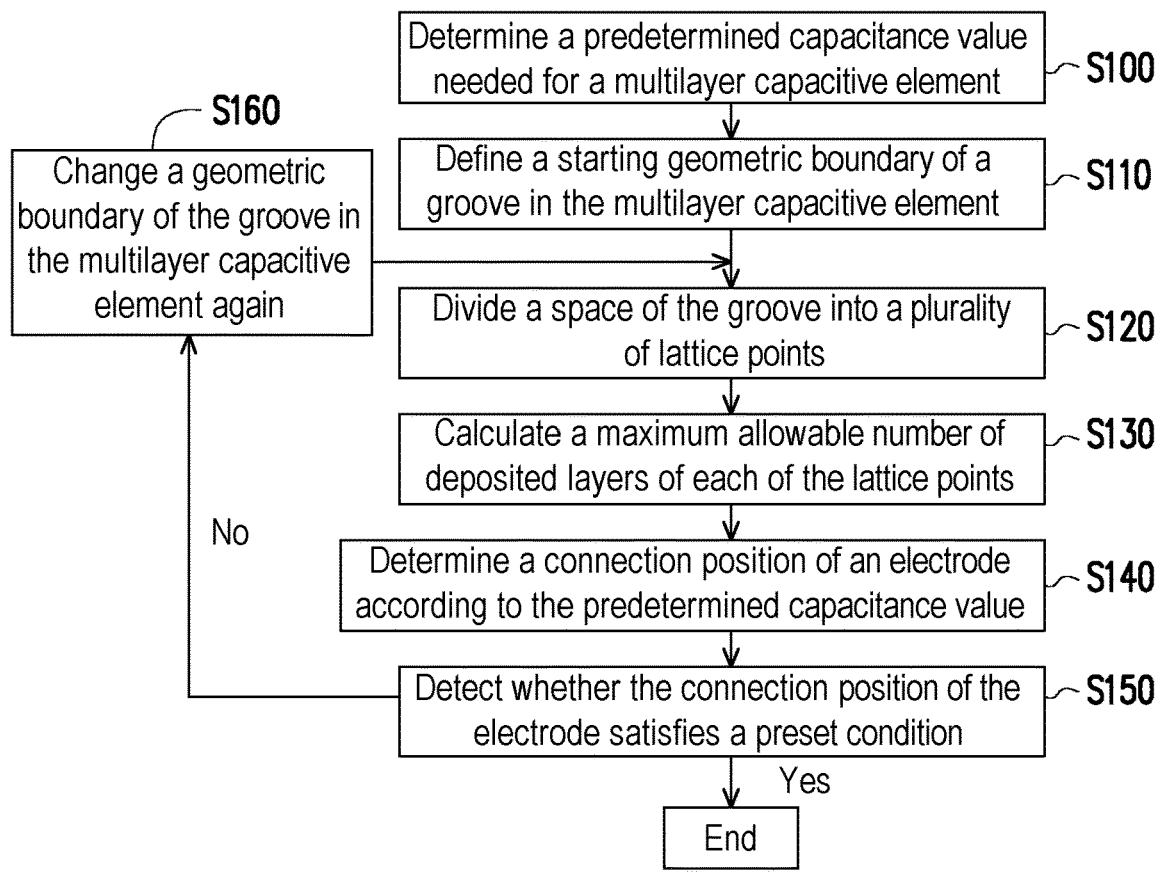
FIG. 5 is a flowchart for explaining the design method of the multilayer capacitive element of the first embodiment of the invention.

The invention provides a design method of a multilayer capacitive element. FIG. 5 is a flowchart for explaining the design method of the multilayer capacitive element of the first embodiment of the invention.

The design method of the multilayer capacitor element of the present embodiment is described below with reference to FIG. 5.

First, step S100 is performed: a predetermined capacitance value needed for a multilayer capacitive element is determined. In an embodiment, the predetermined capacitance value needed for the multilayer capacitive element may be determined according to one or a plurality of given design specifications. In another embodiment, the predetermined capacitance value needed for the multilayer capacitive element may be determined according to the needs of the circuit designer.

Next, step S110 is performed: a starting geometric boundary of a groove in the multilayer capacitive element is defined. In the present embodiment, the starting geometric boundary of the groove means the groove is at a plane boundary in the three-dimensional space, namely, the X-Y plane, X-Z plane, and Y-Z plane. In the present embodiment, the X direction may be a length direction (or width direction) parallel to the bottom surface of the groove; the Y direction may be a width direction (or length direction) parallel to the bottom surface of the groove, and the Y direction is perpendicular to the X direction; the Z direction may be a depth direction perpendicular to the bottom surface of the groove, and the Z direction is perpendicular to the X direction and the Y direction. It should be explained here that, in the present embodiment, the end position of the planarization process (for example, the end of the chemical mechanical polishing process) may determine the boundary of the depth (i.e., the Z direction).

Next, step S120 is performed: a space of the groove is divided into a plurality of lattice points. In the present embodiment, the lattice points are formed by intersecting a plurality of equidistant virtual lines along the X direction, a plurality of equidistant virtual lines along the Y direction, and a plurality of equidistant virtual lines along the Z direction.

Next, step S130 is performed: a maximum allowable number of deposited layers of each of the lattice points is calculated. In the present embodiment, the maximum allowable number of deposited layers refers to the maximum number of layers of a film that may be deposited there. In the present embodiment, each of the lattice points has an allowable number of deposited layers in the X-Z plane, Y-Z plane, and Z direction. In the present embodiment, the allowable number of deposited layers in the Z direction is obtained from an end position of a predetermined planarization process. In the present embodiment, the minimum value of the allowable number of deposited layers of the X-Z plane, the allowable number of deposited layers of the Y-Z plane, and the allowable number of deposited layers in the Z direction is taken as the maximum allowable number of deposited layers of the lattice points. For example, if for a lattice point G the allowable number of deposited layers on the X-Z plane is 3, the allowable number of deposited layers on the Y-Z plane is 4, and the allowable number of deposited layers in the Z direction is 4, then the maximum allowable number of deposited layers of the lattice point G is 3. This is because in the case of the X-Z plane, the groove is already completely filled when deposited to the third layer.

In the present embodiment, the allowable number of deposited layers may be calculated by an aspect ratio (AR), an aspect ratio limit (Rum) of the deposition process, and the thickness of the deposited films. The above parameters may be referred to as the design space of the capacitive element. The following explains how to calculate the allowable number of deposited layers with a multilayer film deposition model.

Figure 6:
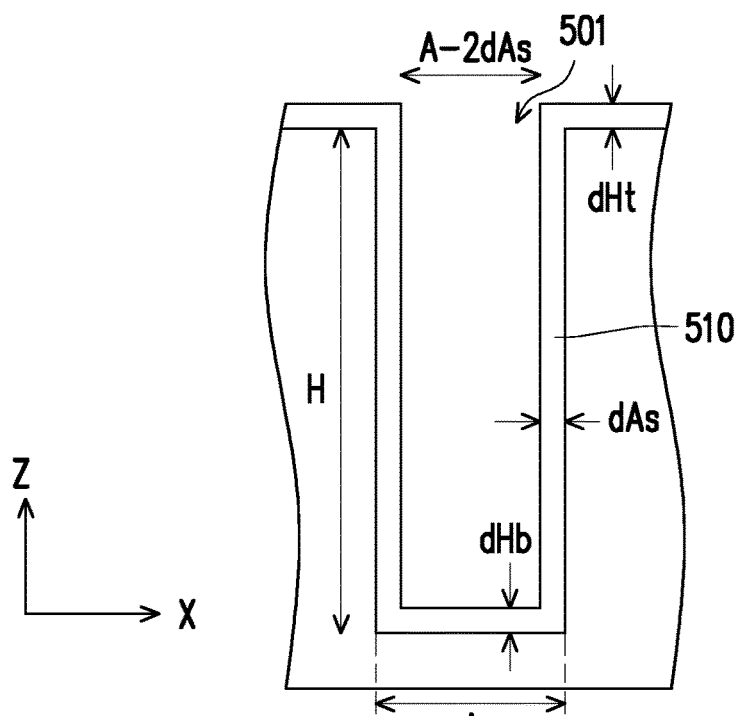
FIG. 6 is a cross-sectional view of a groove in the X-Z plane.

FIG. 6 is a cross-sectional view of a groove in the X-Z plane. Referring to FIG. 6, the width of a groove 501 in the X direction is A, the depth thereof in the Z direction is H, and an initial aspect ratio R of the groove 501 is H/A. After the first layer 510 is deposited, the film thickness of the first layer 510 at the top of the groove 501 is defined as dHt, the film thickness of the first layer 510 at the bottom of the groove 501 is defined as dHb, and the film thickness of the first layer 510 at the sidewall of the groove 510 is defined as dAs. After the first layer 510 is deposited, the width of the groove 501 in the X direction is A−2dAs, and the groove 501 may obtain a new aspect ratio R', and the aspect ratio R' is expressed by the following Equation 1.

$$R' = \frac{H + (dHt - dHb)}{A - 2dAs} \quad \text{[Equation 1]}$$

In the present embodiment, it is assumed that the film thickness of each deposited layer is the same, and when deposited to the nth layer, an aspect ratio $R^{(n)}$ is given by the following Equation 2.

$$R^{(n)} = \frac{H + n \cdot (dHt - dHb)}{A - n \cdot 2dAs} = \frac{H + n \cdot dH}{A - n \cdot 2dAs} \quad \text{[Equation 2]}$$

In Equation 2, dH is dHt−dHb.

In addition, during the deposition process, the following Equation 3 and Equation 4 must be satisfied to ensure the deposition of the next layer.

$$A - n \cdot 2dAs \geq 0 \quad \text{[Equation 3]}$$

$$R^{(n)} \leq R_{lim} \quad \text{[Equation 4]}$$

Equation 3 means that the opening of the groove (that is, the width in the X direction is A) needs to be greater than 2n times the film thickness dAs of the sidewall. Equation 4 means that the aspect ratio of the nth layer needs to be less than the aspect ratio ($R_{lim}$) at the limit of the filling capacity of the deposition process.

The following Equation 5 may be further derived from Equation 3 after conversion.

$$N \leq \frac{a}{2 \cdot dAs} \quad \text{[Equation 5]}$$

Substituting Equation 2 into Equation 4, the following Equation 6 may be further derived.

$$n \leq \frac{R_{lim} \cdot A - H}{R_{lim} \cdot 2dAs + dH} = \frac{A(R_{lim} - R)}{R_{lim} \cdot 2dAs + dH} \quad \text{[Equation 6]}$$

When dH=(dHt−dHb)=0 (that is, when the film thickness dHt at the top of the groove is the same as the film thickness dHb at the bottom of the groove), the following Equation 7 may be further deduced from Equation 6.

$$n \leq \frac{R_{lim} \cdot A - H}{R_{lim} \cdot 2dAs} = \frac{A(R_{lim} - R)}{R_{lim} \cdot 2dAs} \quad \text{[Equation 7]}$$

In the present embodiment, when the film thickness of each deposited layer is the same, the allowable number of deposited layers n may be calculated by Equation 5 and Equation 6. In other words, an allowable number n of deposited layers may be calculated by the aspect ratio (AR), the aspect ratio limit ($R_{lim}$) of the deposition process, and the thickness of the deposited films.

In another embodiment, it is assumed that the film thickness of each deposited layer is not the same, and when deposited to the nth layer, the aspect ratio $R^{(n)}$ is given by the following Equation 8.

$$R^{(n)} = \frac{H + \sum_i (dHt_i - dHb_i)}{A - \sum_i 2dAs_i} \quad \text{[Equation 8]}$$

In Equation 8, i represents the order of each layer. For example, when i is 1, the first layer is indicated.

Similarly, in the present embodiment, during the deposition process, the following Equation 9 and Equation 10 must be satisfied to ensure the deposition of the next layer.

$$A - \sum_i 2dAs_i \geq 0 \quad \text{[Equation 9]}$$

$$R^{(n)} \leq R_{lim} \quad \text{[Equation 10]}$$

Next, Step S140 is performed: a connection position of an electrode is determined according to the predetermined capacitance value. In the present embodiment, since the maximum allowable number of deposited layers of each lattice point in the groove may be inferred in step S130, the end position of the planarization process may be determined according to the predetermined capacitance value, and thus the connection position of the electrode may be determined (that is, the position at which a contact is formed).

In order to ensure that the connection position of the electrode is suitable, after step S140 is performed, step S150 may be further performed: whether the connection position of the electrode satisfies a preset condition is determined. In the present embodiment, the preset condition is, for example, that the capacitance value of the capacitive element satisfies the desired predetermined capacitance value, and the area of the connection position of the electrode is greater than a predetermined area.

If the capacitance value of the capacitive element satisfies the desired predetermined capacitance value, and the area of the connection position of the electrode is greater than a predetermined area (the predetermined area is determined by process requirements), it means that the preset condition is satisfied, and the connection position of the electrode is kept. At this point, the design of the capacitive element is completed. Since the area of the connection position of the electrode of the capacitive element of the invention is greater than the predetermined area, the forming of a contact is facilitated and the electrode is more readily extracted, and the issue of short circuit may be avoided.

If the connection position of the electrode does not satisfy the preset condition, the geometric boundary of the groove in the multilayer capacitive element is changed again (step S160), and step S120, step S130, and step S140 are repeated. Specifically, if the connection position of the electrode does not satisfy the preset condition, the geometric boundary of the groove in the capacitive element is changed again, so that the aspect ratio of a partial region in the groove is changed (step S160). Next, the groove with the new geometric boundary is divided into lattice points again (step S120). Then, the maximum allowable number of deposited layers of each lattice point in the groove with a new geometric boundary is calculated again (step S130). Since the aspect ratio of the partial region in the groove with the new geometric boundary is changed, the maximum allowable number of deposited layers of the lattice points within is also changed. Next, the connection position of the electrode is determined again according to the predetermined capacitance value (step S140). Then, whether the connection position of the electrode satisfies the preset condition is detected again (step S150). Step S120 to step S160 may be repeated until the connection position of the electrode satisfies the preset condition to complete the design of the capacitive element.

In the present embodiment, the method of changing the geometric boundary of the groove in the multilayer capacitive element (step S160) is, for example, to change the geometric boundary of the groove by using a modulation structure, thereby changing the aspect ratio of the partial region in the groove. In the present embodiment, when the modulation structure is designed into a partial region of the groove, the space occupied by the modulation structure may no longer be used to form a capacitor. That is to say, the multilayer film structure of the conductive layers and the dielectric layers may not be formed in the space occupied by the modulation structure. Therefore, when the modulation structure is designed into the groove, a partial geometric boundary of the groove is changed to the geometric boundary of the modulation structure, thus changing the aspect ratio of the partial region in the groove.

The following embodiments are given to illustrate the multilayer capacitive device of the invention and the design method thereof, but these embodiments are not intended to limit the scope of the invention. The figures are diagrams for illustrative purposes only, and do not represent limitations on their actual methods, conditions, or devices.

Embodiment 1

Figure 7A:
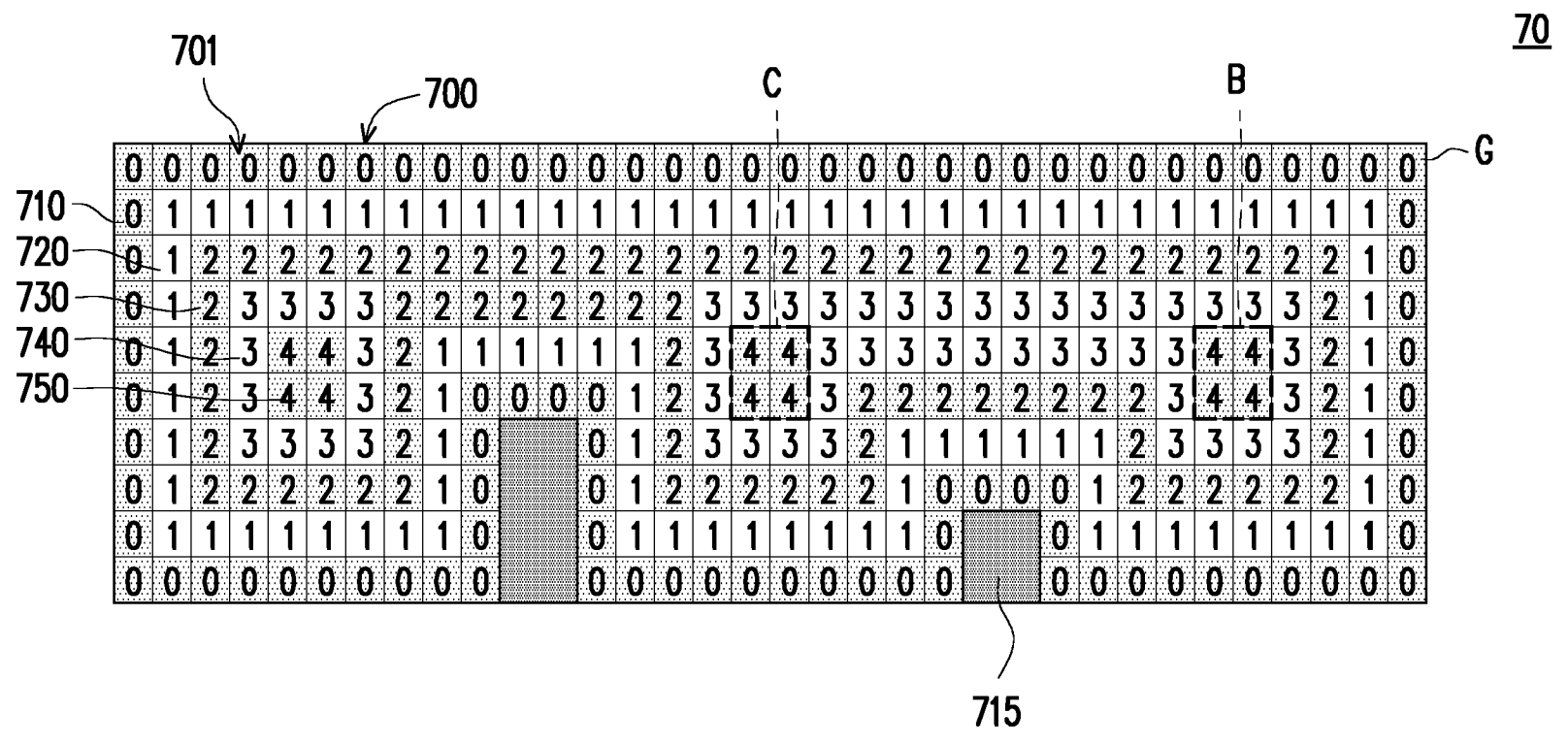
Figure 7B:
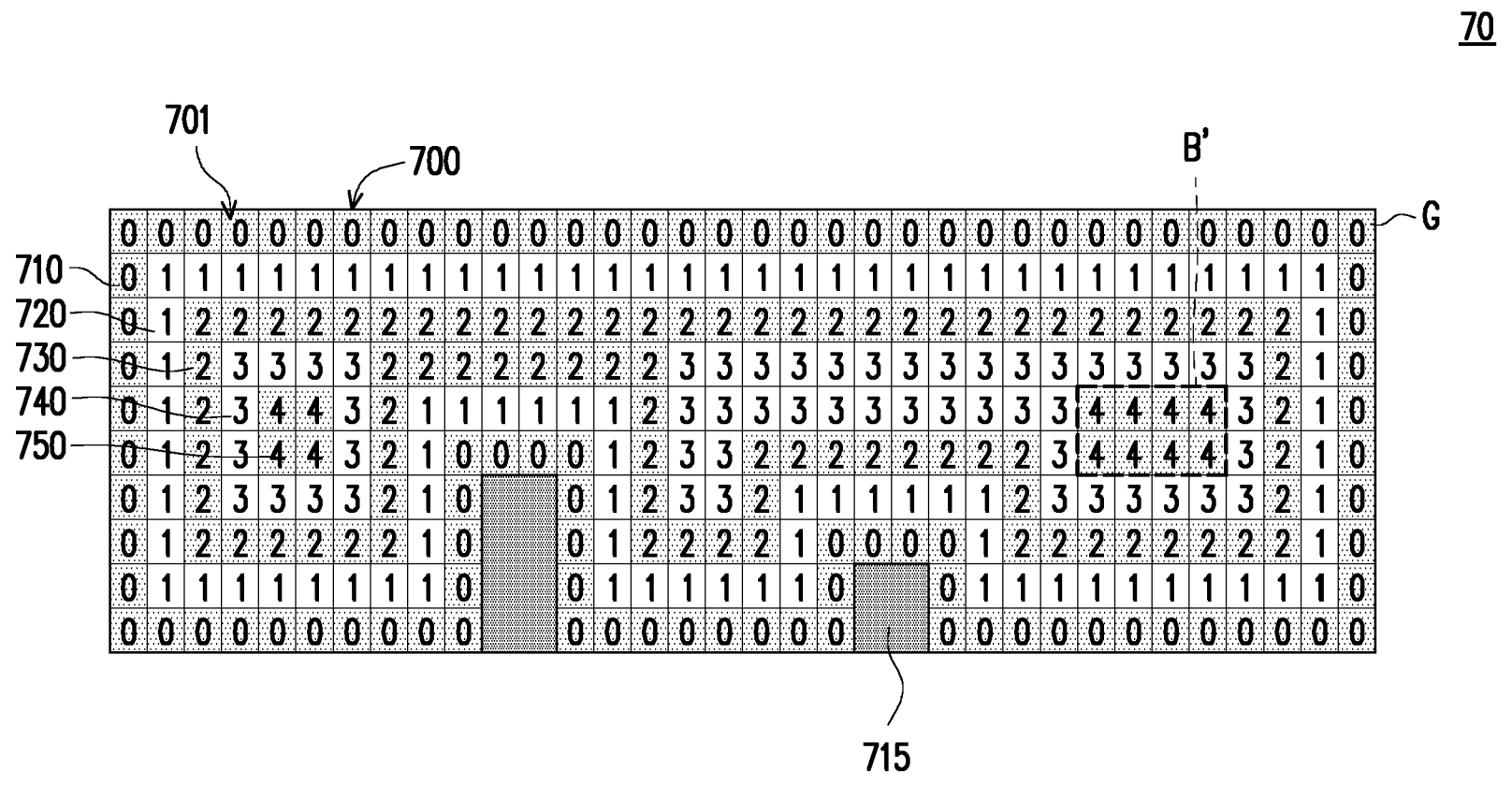

FIG. 7A and FIG. 7B are top views of a simulated multilayer capacitive element of an embodiment of the invention. Referring to FIG. 7A, a groove 701 of a substrate 700 of a multilayer capacitive element 70 is divided into a plurality of lattice points G in the two-dimensional extending direction, and the numbers 0 to 4 in each lattice point represent the order of the deposited layers. In detail, conductive layers and dielectric layers are alternately deposited in sequence in the groove (a total of 5 layers, the conductive layer is deposited first), and the numbers 0 to 4 of the lattice points respectively represent a first conductive layer 710, a first dielectric layer 720, a second conductive layer 730, a second dielectric layer 740, and a third conductive layer 750 deposited in sequence. As shown in FIG. 7A, a region B (that is, the position at which a contact is formed) formed by the lattice point of number 4 is a possible connection position of an electrode (that is, the position of the third conductive layer 750), and the region B includes 4 lattice points.

If the area of the region B is to be increased, an aspect ratio modulation structure 715 on the right in FIG. 7A may be moved to the left by 2 lattices. Specifically, as shown in FIG. 7B, when the aspect ratio modulation structure 715 is moved to the left by 2 lattices, the area of a region B' is increased to 8 lattice points, and a region C of FIG. 7A disappears. This is because the position of the aspect ratio modulation structure 715 on the right is changed, causing the aspect ratio modulation structure to squeeze or elongate the boundary of the multilayer film deposited in a certain direction and change the aspect ratio of a certain region, so that a film deposited later may not be deposited in a partial region (such as the region C), or the space of the partial region is elongated, so that a film deposited later may be deposited (such as the region B').

As shown in FIG. 7B, since the area (the region B') of the third conductive layer 750 is greater, using the region B' as the connection position of an electrode facilitates the forming of a contact and makes the electrode more readily extracted, and the issue of short circuit may be avoided.

Embodiment 2

Figure 8A:
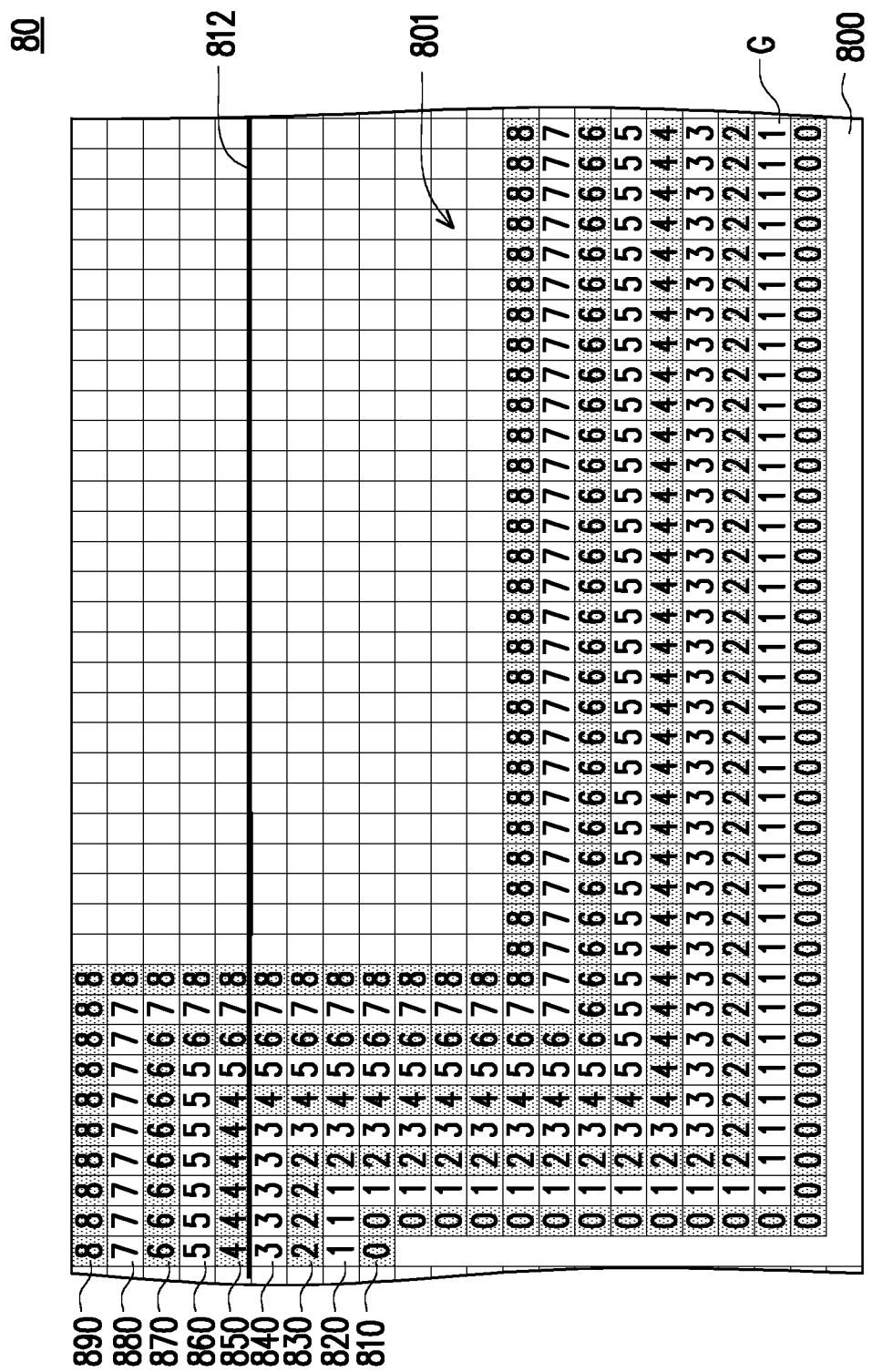
FIG. 8A and FIG. 8H are cutaway views of a simulated multilayer capacitive element of an embodiment of the invention.
Figure 8B:
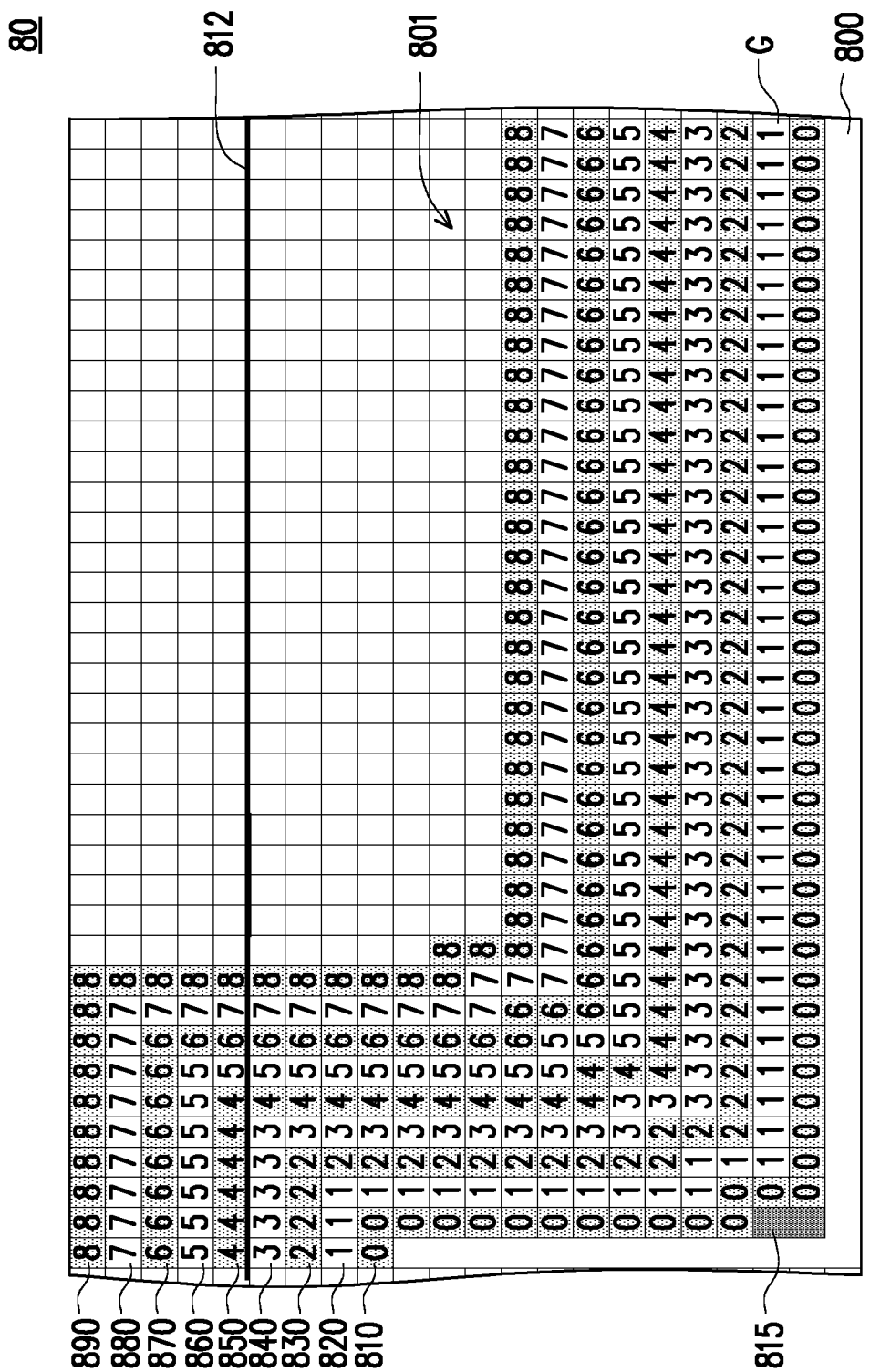
Figure 8C:
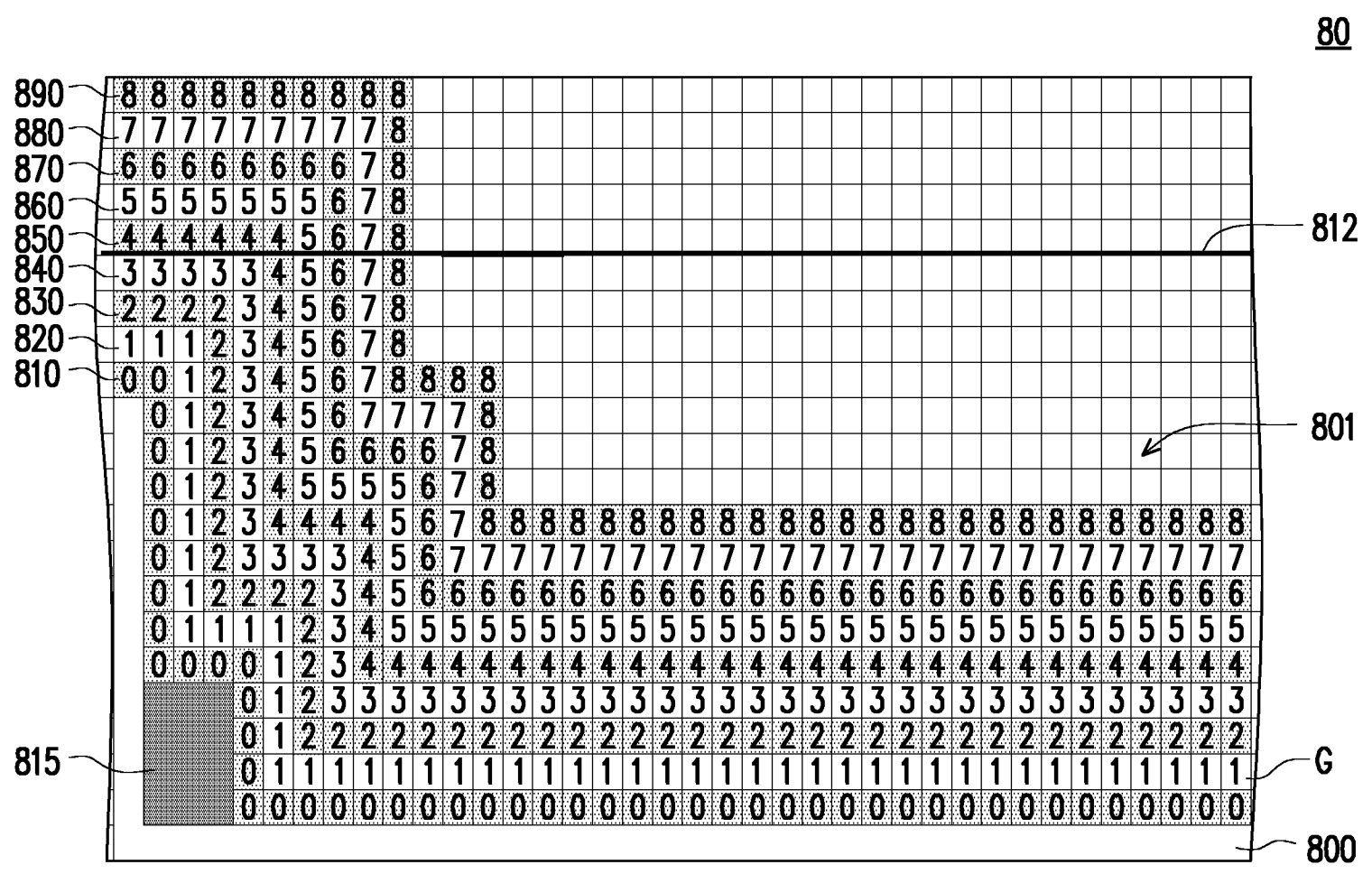
Figure 8D:
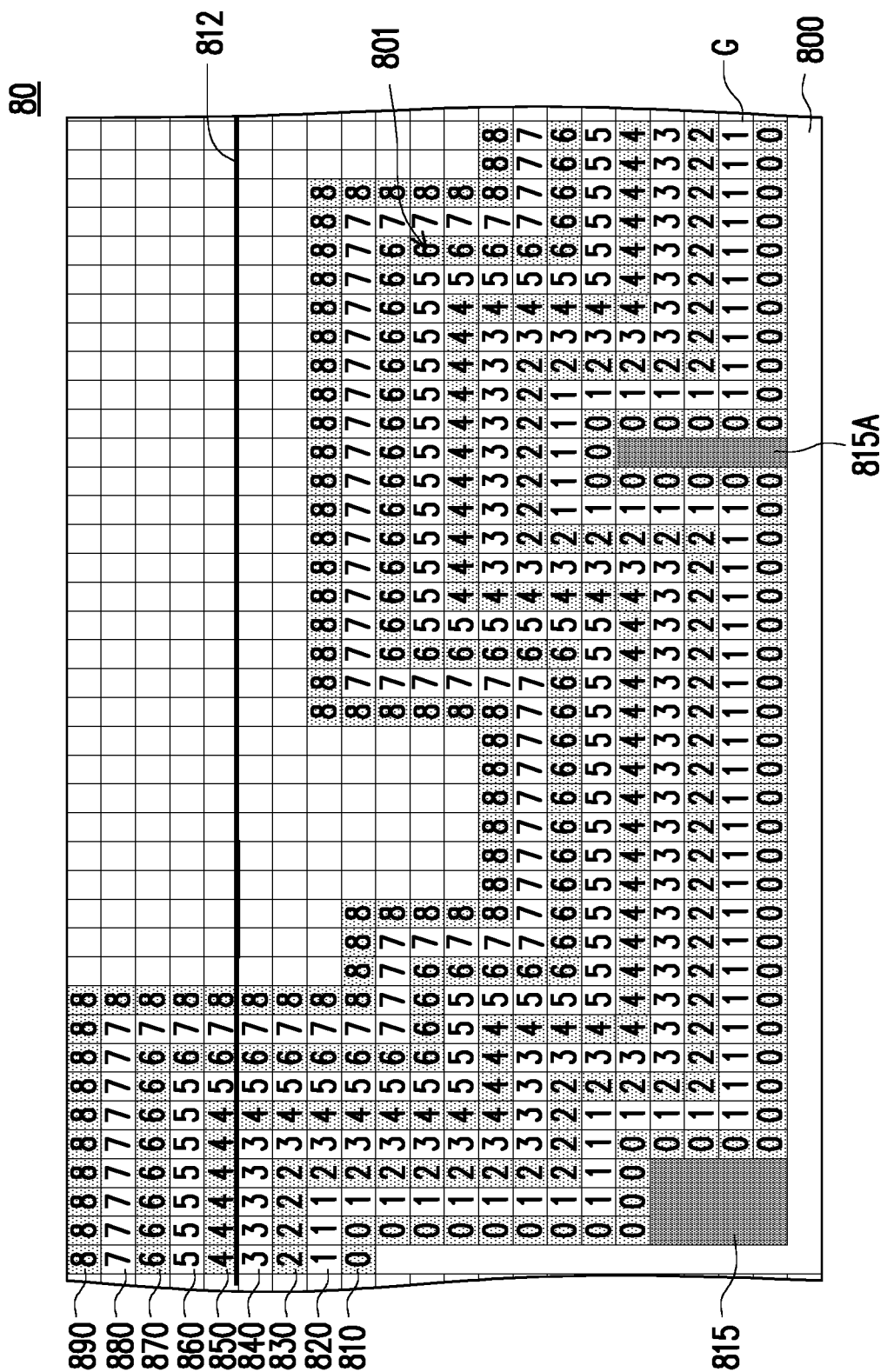
Figure 8E:
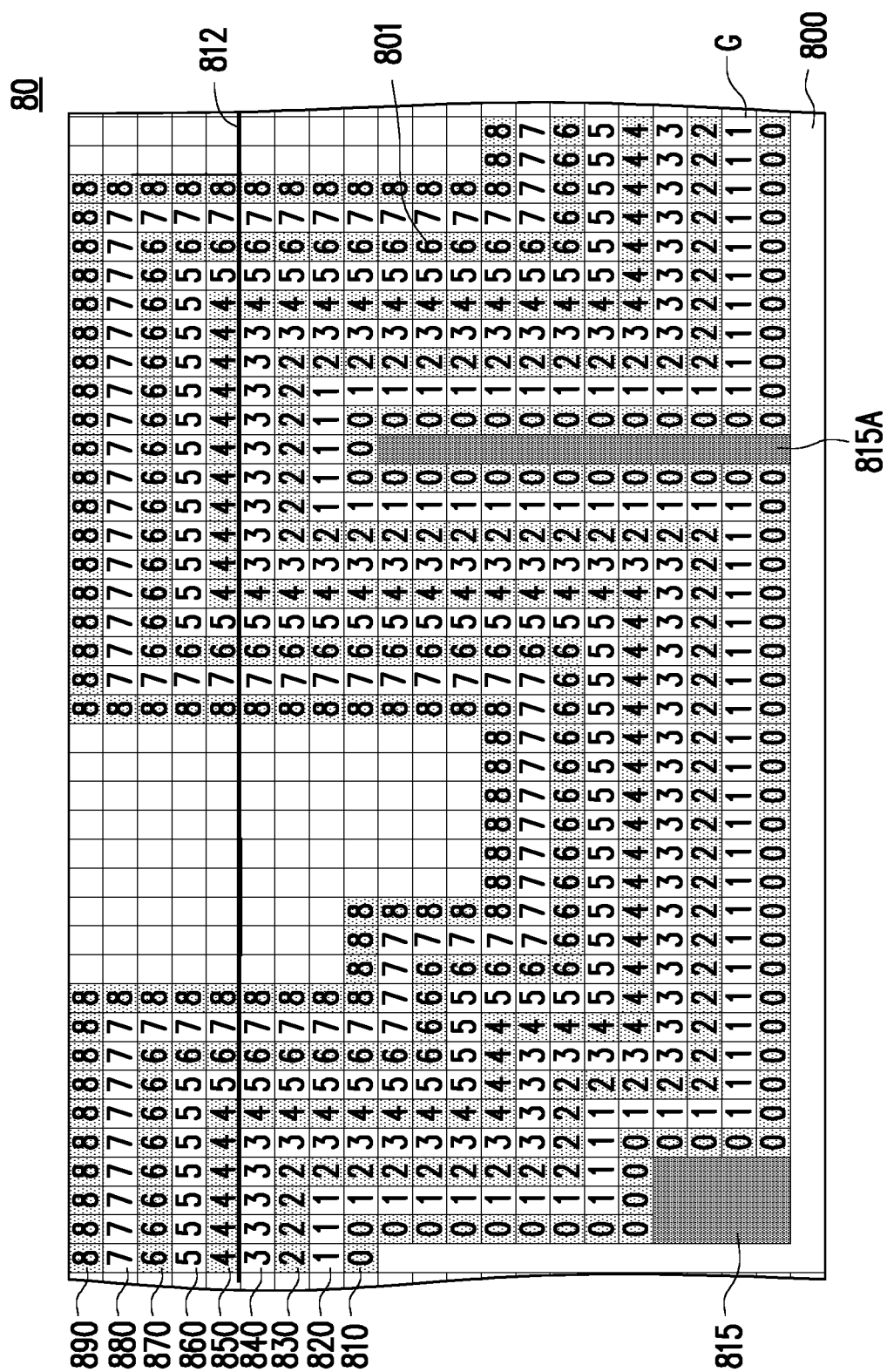
Figure 8F:
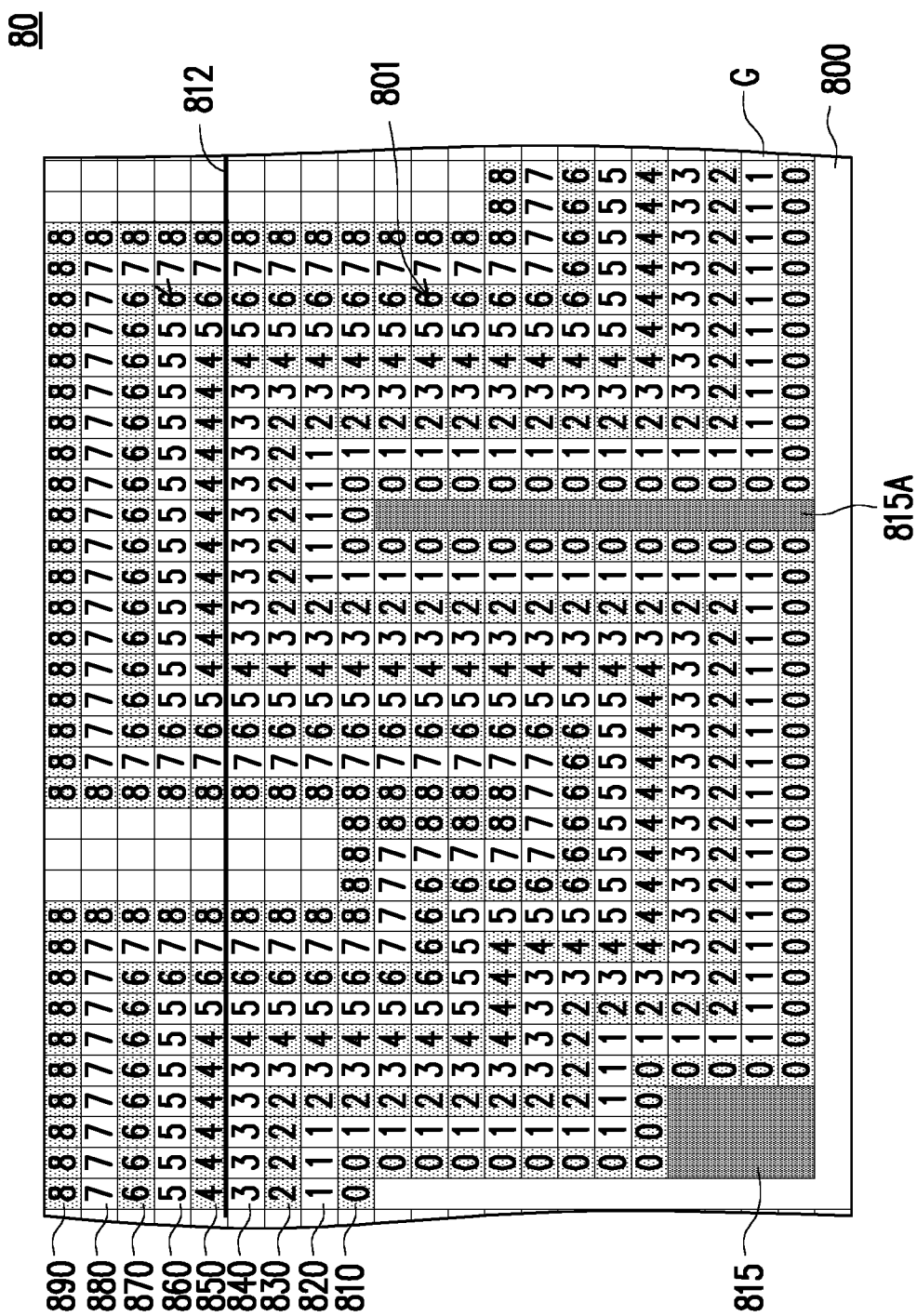
Figure 8G:
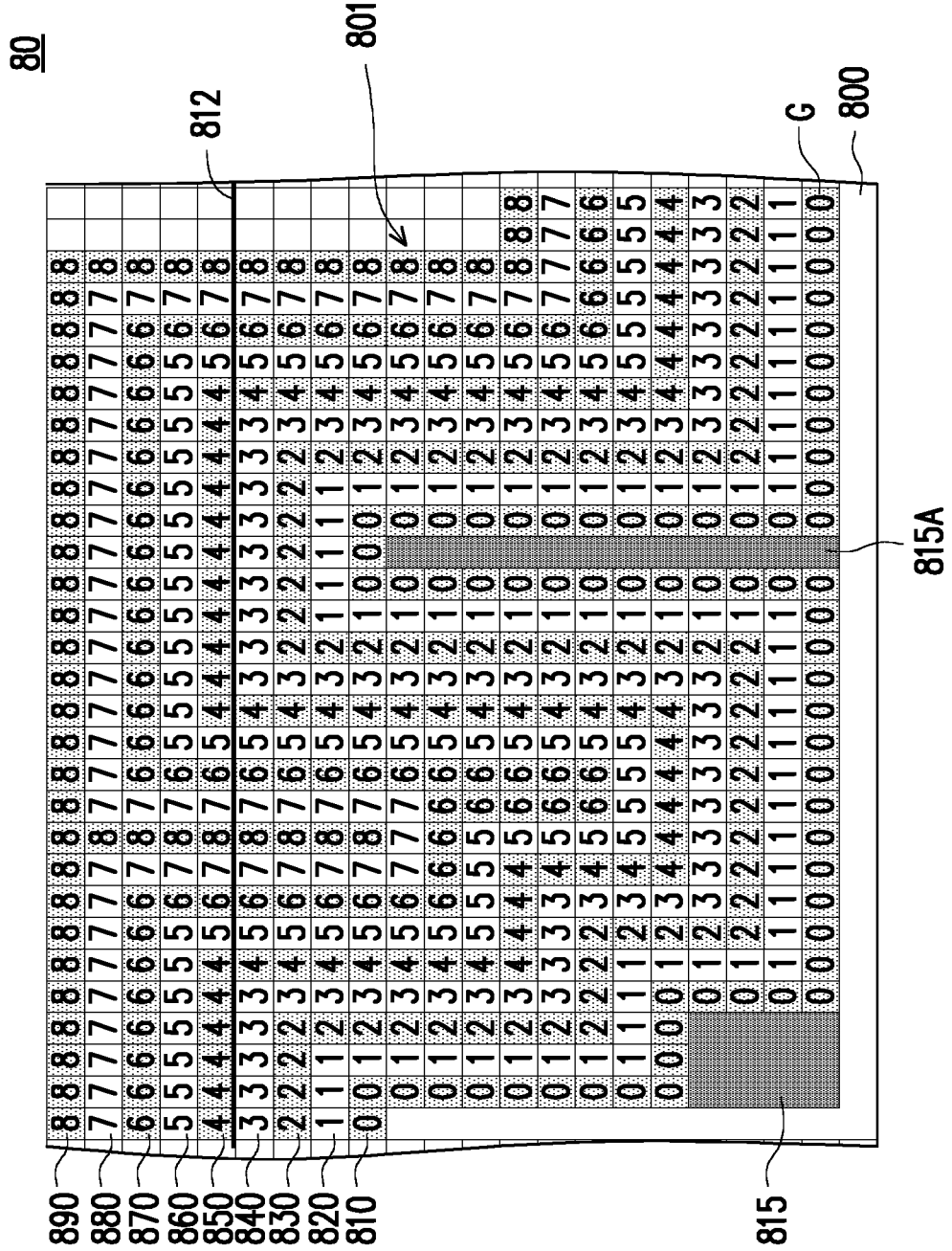
Figure 8H:
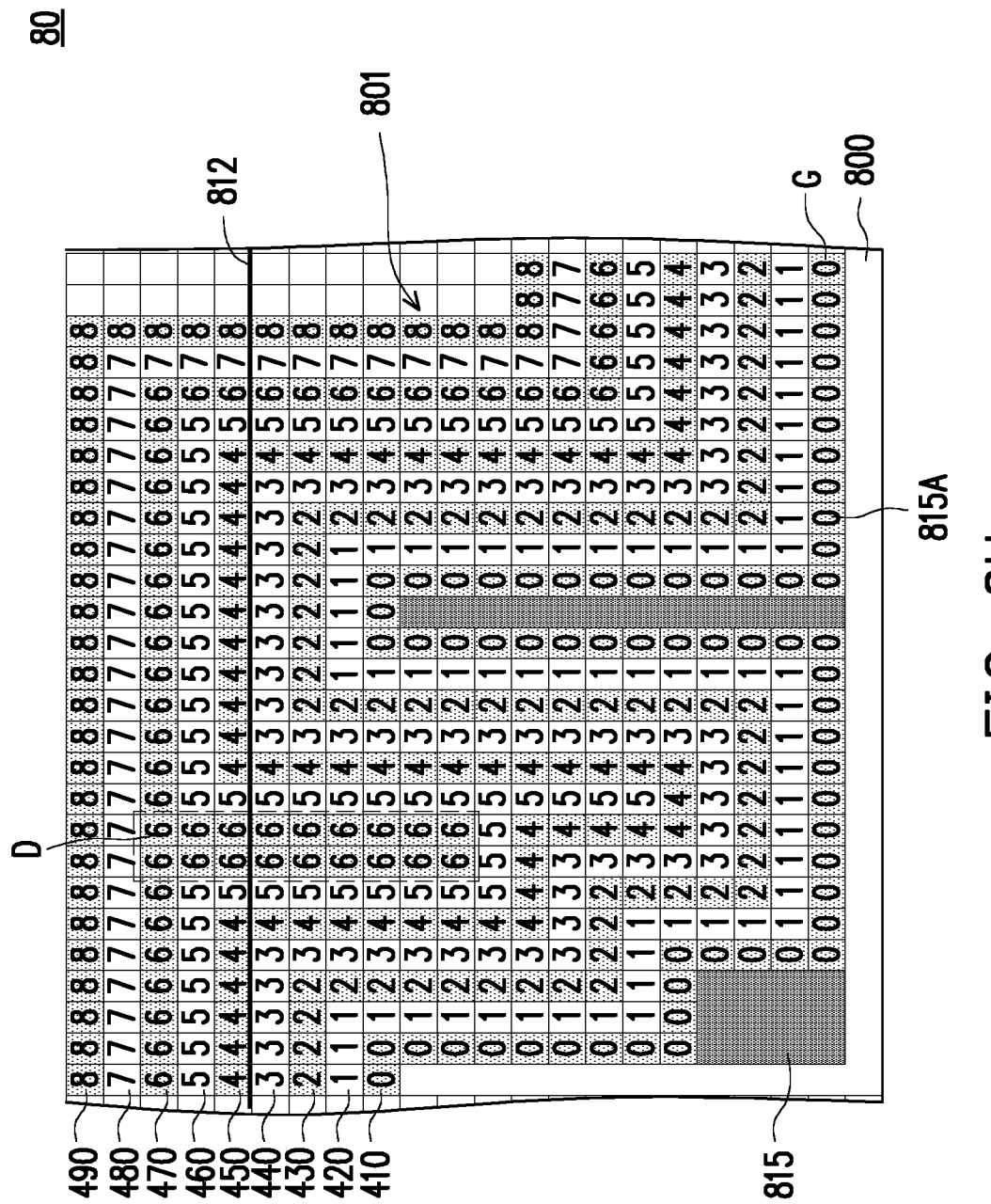

FIG. 8A and FIG. 8H are cutaway views of a simulated multilayer capacitive element of an embodiment of the invention. Referring to FIG. 8A, a groove 801 of a substrate 800 of a multilayer capacitive element 80 is divided into a plurality of lattice points G in the two-dimensional extending direction, and the numbers 0 to 8 in each lattice point represent the order of the deposited layers. In detail, conductive layers and dielectric layers are alternately deposited in sequence in the groove (a total of 9 layers, the conductive layer is deposited first), and the numbers 0 to 8 of the lattice points respectively represent a first conductive layer 810, a first dielectric layer 820, a second conductive layer 830, a second dielectric layer 840, a third conductive layer 850, a third dielectric layer 860, a fourth conductive layer 870, a fourth dielectric layer 880, and a fifth conductive layer 890 deposited in sequence. The two-dimensional coordinate information of each lattice point contains the correspondingly deposited film on the substrate (or in the groove). The end position of the planarization process may be determined according to the desired predetermined capacitance value. In the present embodiment, the position of an end line 812 represents the end position of the planarization process.

Referring to FIG. 8B, a first aspect ratio modulation structure 815 may be disposed in the groove 801. In the present embodiment, due to the placement of the aspect ratio modulation structure 815, the geometric boundary of the groove 801 and the aspect ratio of a partial region are changed, thereby changing the pattern of the deposited film. In the present embodiment, the same material as the substrate 800 may be used as the material of the aspect ratio modulation structure 815.

Referring to FIG. 8C, the size of the aspect ratio modulation structure 815 is increased to increase the pattern change of the deposited film.

Referring to FIG. 8D and FIG. 8E, a second aspect ratio modulation structure 815A may be further disposed in the groove 801, and the size of the second aspect ratio modulation structure 815A may be changed to further change the geometric boundary of the groove and the aspect ratio of a partial region to change the pattern of the deposited film. In the present embodiment, the same material as the substrate 800 may be used as the material of the aspect ratio modulation structure 815A.

It should be explained here that the change of the geometric boundary of each groove (by changing the number of aspect ratio modulation structures or changing the size of aspect ratio modulation structures) may result in one possible connection position of an electrode. If it is determined that the connection position of the electrode satisfies the preset condition, then the connection position of the electrode is kept. If the connection position of the electrode does not satisfy the preset condition, then the geometric boundary of the groove in the multilayer capacitive element is changed again (that is, the number of aspect ratio modulation structures or the size of the aspect ratio modulation structure is changed). Taking the structure of FIG. 8A to FIG. 8D as an example, according to the planar cross-section generated at the end of the planarization process, none of the possible connection locations of the electrode satisfies the preset condition (i.e., the desired predetermined capacitance value and the predetermined connection area are not satisfied).

Referring to FIG. 8E to FIG. 8H, the position of the second aspect ratio modulation structure 815A may be changed to change the geometric boundary of the groove and the aspect ratio of a partial region, thereby changing the pattern of the deposited film. As shown in FIG. 8H, according to the planar cross-section generated at the end of the planarization process, a region D formed by the lattice point of number 6 satisfies the desired predetermined capacitance value and has a greater connection area, and therefore may be used as a suitable connection position of an electrode.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A multilayer capacitive element, comprising:
   a substrate having a groove;
   a first aspect ratio modulation structure located in the groove to define the groove as a first region and a first modulation region, wherein an aspect ratio of the first modulation region is different from an aspect ratio of the first region; and
   a plurality of conductive layers and a plurality of dielectric layers alternately stacked in the groove,
   wherein at least one of the plurality of conductive layers is only disposed in the first region and not disposed in the first modulation region, in a top view,
   wherein at least one conductive layer in the plurality of conductive layers is extended from the first region to the first modulation region, in a top view,
   wherein a topmost conductive layer in the at least one conductive layer extended from the first region to the first modulation region completely fills a space of the groove of the first modulation region, in top view, and
   wherein the plurality of conductive layers and the plurality of dielectric layers are not disposed on a top surface of the first aspect ratio modulation structure.

2. The multilayer capacitive element of claim 1, wherein a topmost conductive layer in the plurality of conductive layers completely fills a space of the groove.

3. The multilayer capacitive element of claim 1, wherein the first aspect ratio modulation structure defines the groove as the first region, the first modulation region, and a second region, wherein the first modulation region is located between the first region and the second region, and the aspect ratio of the first modulation region is different from the aspect ratio of the first region and an aspect ratio of the second region.

4. The multilayer capacitive element of claim 3, wherein the at least one conductive layer in the plurality of conductive layers is extended from the first region to the first modulation region and the second region.

5. The multilayer capacitive element of claim 1, further comprising a second aspect ratio modulation structure located in the first region to define the first region as a third region, a second modulation region, and a fourth region, wherein an aspect ratio of the second modulation region is different from an aspect ratio of the third region and an aspect ratio of the fourth region.

6. The multilayer capacitive element of claim 5, wherein at least one conductive layer in the plurality of conductive layers is extended from the third region to the second modulation region and the fourth region.

7. The multilayer capacitive element of claim 6, wherein a topmost conductive layer in the at least one conductive layer extended from the third region to the second modulation region and the fourth region completely fills a space of the groove of the second modulation region.

8. The multilayer capacitive element of claim 5, wherein a material of the second aspect ratio modulation structure is the same as a material of the substrate.

9. The multilayer capacitive element of claim 1, wherein a material of the first aspect ratio modulation structure is the same as a material of the substrate.

10. The multilayer capacitive element of claim 1, wherein a bottommost layer in the plurality of conductive layers and the plurality of dielectric layers is one of the conductive layers.

11. The multilayer capacitive element of claim 1, wherein a bottommost layer in the plurality of conductive layers and the plurality of dielectric layers is one of the dielectric layers.

* * * * *